US010097201B1

(12) United States Patent
Gopal et al.

(10) Patent No.: US 10,097,201 B1
(45) Date of Patent: Oct. 9, 2018

(54) LZ77 COMPRESSION OF DATA WITH DATA RUNS

(71) Applicant: Intel Corporation, Santa Clara, CA (US)

(72) Inventors: Vinodh Gopal, Westborough, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/828,137

(22) Filed: Nov. 30, 2017

(51) Int. Cl.
*H03M 7/40* (2006.01)
*H03M 7/30* (2006.01)

(52) U.S. Cl.
CPC ....... *H03M 7/3086* (2013.01); *H03M 7/6023* (2013.01)

(58) Field of Classification Search
CPC .... H03M 7/3086; H03M 7/3084; H03M 7/40; H03M 7/3088; H03M 7/42; H03M 7/46; H03M 7/30; H03M 7/425; H03M 7/6005; H03M 7/607; H03M 7/3059; H03M 7/3079; H03M 7/4093; H03M 7/3082; H03M 7/4006
USPC ............................................. 341/51, 65, 67
See application file for complete search history.

(56) References Cited

U.S. PATENT DOCUMENTS

| 5,281,967 | A | * | 1/1994 | Jung | .................... | H03M 7/3086 |
| | | | | | | 341/51 |
| 5,861,827 | A | * | 1/1999 | Welch | ................. | H03M 7/3088 |
| | | | | | | 341/51 |
| 5,883,588 | A | * | 3/1999 | Okamura | ............ | H03M 7/3086 |
| | | | | | | 341/5 |
| 5,951,623 | A | * | 9/1999 | Reynar | .................... | G06T 9/005 |
| | | | | | | 341/106 |
| 2001/0026231 | A1 | * | 10/2001 | Satoh | ................... | H03M 7/3086 |
| | | | | | | 341/87 |
| 2002/0140583 | A1 | * | 10/2002 | Parenteau | ........... | H03M 7/3084 |
| | | | | | | 341/51 |
| 2005/0193022 | A1 | * | 9/2005 | Rigerts | .................... | H03M 7/30 |
| 2013/0135123 | A1 | * | 5/2013 | Golander | ............ | H03M 7/6076 |
| | | | | | | 341/65 |
| 2015/0280736 | A1 | * | 10/2015 | Ogasawara | ......... | H03M 7/3059 |
| | | | | | | 341/51 |
| 2016/0048531 | A1 | * | 2/2016 | Hubris | .............. | G06F 17/30153 |
| | | | | | | 707/693 |
| 2016/0285473 | A1 | * | 9/2016 | Kim | .................... | H03M 7/6029 |
| 2016/0336962 | A1 | * | 11/2016 | Henry | ................. | H03M 7/3086 |

* cited by examiner

*Primary Examiner* — Linh Nguyen
(74) *Attorney, Agent, or Firm* — Schwegman Lundberg & Woessner, P.A.

(57) ABSTRACT

Methods and apparatus are described by for compressing data using LZ77 compression. Embodiments determine an initial run from input data. The initial run includes repeating data at a first location and has a first length. A hash chain is updated with a proper set of hashes from prefixes from the initial run. A first search engine determines a second run that includes the repeating data at a second location. The second run has a second length less than the first length. A first matching location is determined within the input data having the repeating data using the hash chain and the second run. The first matching location is the first location. The first matching location, the second location, and the second length are written to an output buffer. The output buffer includes a compressed version of the input data.

25 Claims, 12 Drawing Sheets

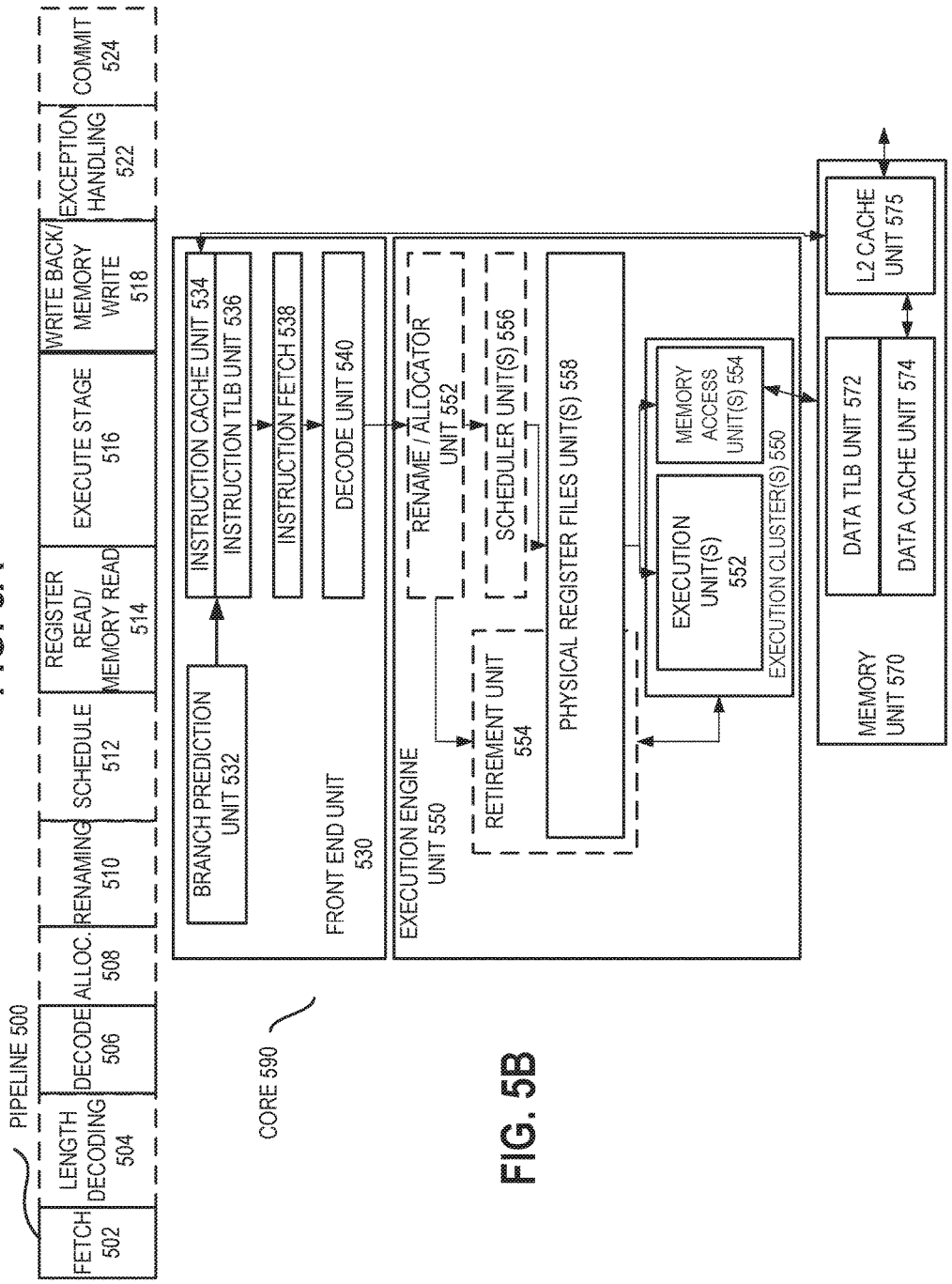

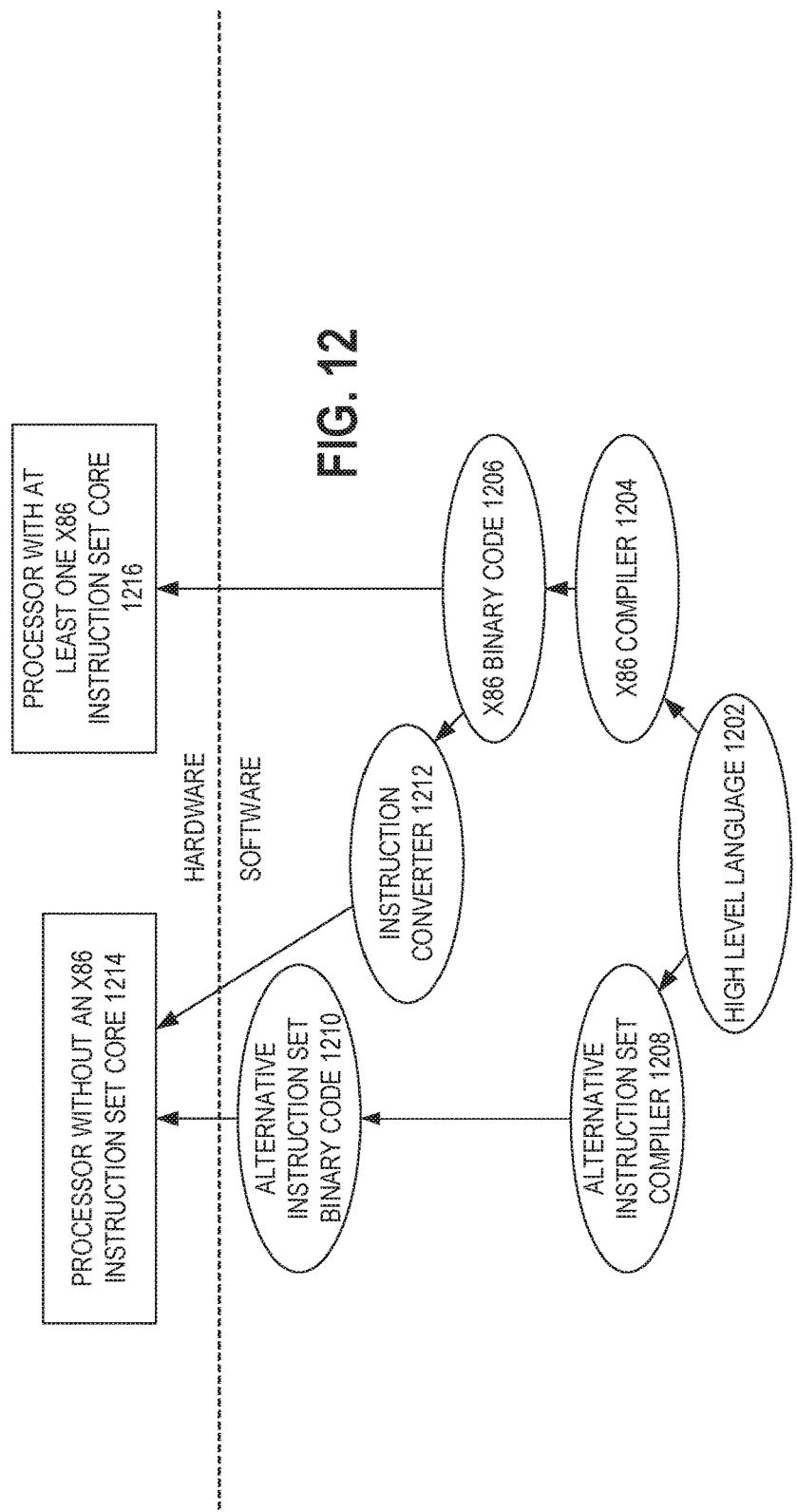

LZ77 COMPRESSION OF DATA WITH DATA RUNS

TECHNICAL FIELD

Embodiments described herein relate generally to data compression. Some embodiments relate to improving the speed of LZ77-based compression algorithms. Embodiments are implemented in hardware, software, or a mix of both hardware and software.

BACKGROUND

LZ77 is a lossless data compression algorithm. One algorithm that uses LZ77 is DEFLATE. DEFLATE is widely used and forms the basis for formats such as gzip/zlib and Winzip/PKZIP. LZ77 compression looks for the longest string from a history buffer, also called a sliding window, which matches the current location's string in the input buffer. A hash function is performed on an (n)-byte prefix of the current string to generate a hash table index and lookup a data structure that returns a list of locations/pointers into the history buffer where possible matches may be found. The compression process typically searches a large number of locations and determines the longest/best match, and then encodes the length/distance of the best match. The effort (e.g., number of searches attempted) is controlled by a compression level. Gzip/zlib define a number of levels of compression, ranging from 1 to 9, with 9 being the best compression ratio, but at the cost of the greatest amount of processing (e.g., up-to 4K searches per byte position).

BRIEF DESCRIPTION OF THE DRAWINGS

FIG. 5A is a block diagram illustrating both an exemplary in-order pipeline and an exemplary register renaming, out-of-order issue/execution pipeline according to embodiments of the invention.

FIG. 5B is a block diagram illustrating both an exemplary embodiment of an in-order architecture core and an exemplary register renaming, out-of-order issue/execution architecture core to be included in a processor according to embodiments of the invention;

FIG. 12 is a block diagram contrasting the use of a software instruction converter to convert binary instructions in a source instruction set to binary instructions in a target instruction set according to embodiments of the invention.

DETAILED DESCRIPTION

Figure 1:
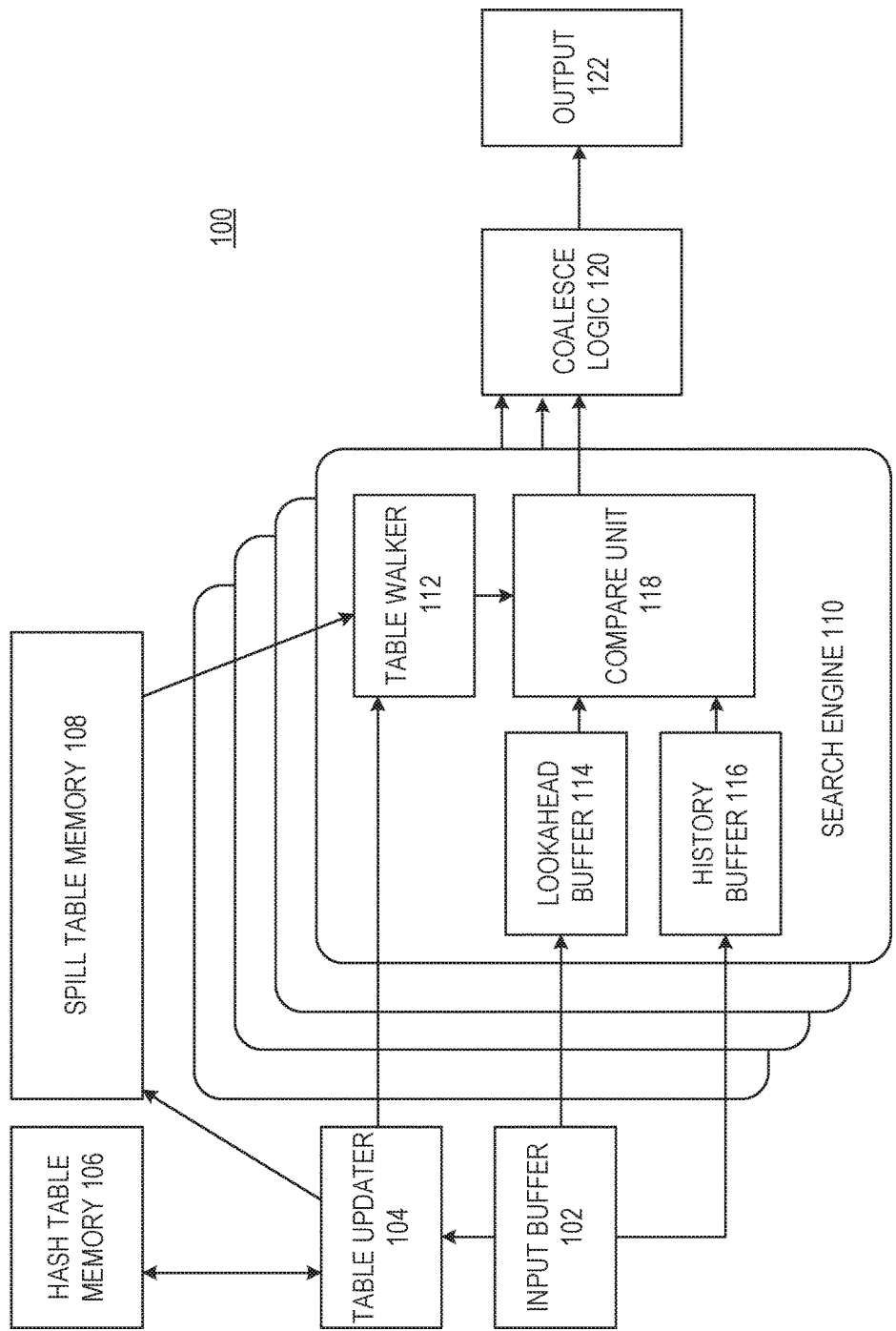
FIG. 1 illustrates an LZ77 architecture according to some embodiments.

The present disclosure is related to improving the compression speed of LZ77 based compression. Some implementations of LZ77 compression use a fixed effort level and number of searches of the history buffer for the entire file being compressed (without analyzing the type of data being compressed). For high compression level settings, the number of searches for each byte position of the input file may be very high (e.g., up to 4,000 searches for compression level 9). For average content types, the hash chains tend to be short (e.g., <64 locations averaged across all chains). Shorter hash chains result in better performance of the compression engine compared to longer hash chains. However, when runs of a single character (e.g., 1,000 bytes long), 998 positions may be recorded in the hash chains with each of the positions having the same 3-byte prefix used to hash possible locations. This happens each time a run is encountered of this character, resulting in an extremely long hash chain for this character run. Then when matching at a position that is part of such a run, the hash chain would only get limited by the max limit set for this level of compression, resulting in a very large number of positions being searched. So, without any special processing for runs an extreme variance in performance between a file like a virtual reality geo file (33 Gbits/s) that typically has no runs, and other types such as a picture file that may have a large number of runs (12 Gbits/s) is seen.

In an example, when implementations are configured to run at higher levels of compression a run of literals may be detected and using the run of literals the string matching process may be accelerated. The search results from previous bytes in the run may be used to calculate results for the remaining bytes of the run which may drastically improve performance of the search engines by reducing the effort or number of searches the search engine needs to perform. Thus, the best length/distance results may be determined from the compare of a previous byte of the run to calculate the result of the matching process for the remaining bytes of a run. In an example, the result is a length/distance pair. In various implementations, the numbers of searches by the search engine that performs the compare operations may be reduced. Such a reduction can increase the performance of the LZ77 compression implementation by reducing the number of positions or bytes of the file that the search engine compares without negatively impacting the compression ratio.

In addition, in an example, the hash chains for various positions within a run do not need to be updated. For example, after a prefix of a run is used to update the hash chain, the remaining positions of the run can be ignored in regard to updating the hash chains. The skipping of updates for the hash chains that are indexed by a run results in fewer pointers for that hash chain. The fewer pointers that are in the hash chain also improves performance by reducing the number of pointers being compared for any string that indexes that hash chain.

In an example, a data pattern of a run of literals that have the same value within an input file is detected. The run of literals may include 10, 20, 100, 1,000, or more of the same literal. For example, a file may include 1,000 bytes of 0x0 that is detected as a run of the literal 0x0. As another example, the file may include 2,000 bytes of the string "ab" that is detected as the run of the literal "ab". If the run is long enough, then a high compression ratio may still be obtained without performing searches for every byte position of the input file. Specifically, searching for certain byte positions of the run can be ignored.

Current implementations of LZ77 may have their search engine or search engines spending a lot of effort trying to compress files that have long runs of literals. In the case of a long run of literals the best result (longest match with shortest distance) found by the search engine for a run was typically the second byte of the run of literals having a distance of 1 and a length that is equal to the number of bytes in the run minus the first byte. For example, a run of 1,000 'a' may have a first result of the literal 'a' with a length of one. The rest of the run may have a second result of a distance of 1 and a length of 999. Accordingly, the second result references the first result based upon the distance of 1 and then repeating the literal 'a' 999 times, resulting in a compressed version of the 1,000 'a' values.

In various examples, a result for the remaining bytes within a run may be calculated using the result from a compare of a previous byte within the run, without performing the compare for that byte position. As an example if there is a first run of literals having a value of 0x0 which repeats for 16 bytes of the input data. In various examples, this run of literals would result in a LZ77 compressed output of 1 literal value=0x0 for the first byte, followed by a length/distance pair of Length=15, Distance=1 for the second byte. Using this example, a best match that may be found by the search engine was on the second byte of the run. Note that if there was a run of 0's at least as long as 16 previously found in the input (within the history window), then the search engine would find a full match of length 16 referencing the distant string (e.g. the best match would be found at the first byte).

As the best match for a run of literals is often found at the first or second byte position of the run, matches at any other byte position in the run may be skipped. This is due to how global matching happens in the higher levels of compression, whereby one needs to find best matches at every position and then a global match is committed to at a later point. Thus, search results for previous bytes of the input file may have match lengths that end at any byte offset within this run, requiring a next match to start at any position inside this run. As some matches within a run may be skipped, match results for all bytes within the run may be calculated from the previous match reference. For example, the result from the second byte of the run and subtract a value of 1 from the length to produce the result of the third byte. We then subtract a value of 1 from the length of the result for the third byte to produce the result for the fourth byte and so on until the end of the run, e.g., the length value is decremented until reaching the value of one.

In an example, a high compression ratio LZ77 compression engine may use a hash table data structure for storing the locations where possible matches may be found. A hash function is performed on an (m)-byte prefix of the current string to generate a hash table index (which may be referred to as a hash chain), and is used to lookup the hash table data-structure which returns a list of locations/pointers into the history where possible matches may be found.

In an example, where the results for the trailing bytes of a run of literals are calculated from the search results of prior bytes, the updates to the hash chain that is indexed by the current string, e.g., substring of the current run, may be skipped. By skipping updates to the hash chain, the overall length of the hash chain may be reduced. In an example, only the first "N" byte locations at the start of a run of literals need to be updated and the updates and the searches for all other bytes within the run may be skipped. In one example, the value of "N" is determined from the number of search engines used in the LZ77 compression implementation. For example, a LZ77 hardware compression system may use 'N' number of search engines.

Skipping updates within a long run may impact the compression ratio for the matching process at a subsequent run. For example, suppose there is a long run of a 1,000 "a"'s, followed by the string "xyz", and then by another long run of "a"'s of length 256 (followed by "bcd"). The best match for the second run will be a full match based on the earlier run of 1,000 "a"'s. The distance value of the results from the second run, however, may be suboptimal since the hash table structure was not updated at every position in the first long run. Rather, just the first location may be updated. With just the hash table, the search engine may result in a match like <length=256, distance=1003>. Instead a much smaller distance <length=256, distance=259> would be better since larger distances use more bits to encode. Using a distance needing more bits to encode may negatively impact the compression ratio even with the best full match in terms of match lengths. The negative impact on the compression ratio may be eliminated by using the full match that the closest distance.

In one example, the match distance may be adjusted. Thus, the smallest distance may be determined without needing to update all positions in the first run. In an example, an initial match is found as <length=256, distance=1003>. Next, the reference string that starts 1,003 positions from the current run may be analyzed or a data structure describing a possible run from the 1,003 position from the second run may be analyzed. For example, a data structure may indicate that the reference string is a run of a length of 1,000. In another example, the character following the reference string is examined to determine there is an additional 'a' following the reference string. Therefore, the best match may be adjusted to <length=256, distance=1002>. That is, the start of the reference string may be moved one character closer to the start of the second run. The examination process may continue and notice there is another following 'a'. This process may repeat until the reference string reaches a character other than an 'a', e.g., 'x', decrementing the effective distance each time by one, but keeping the match-length constant. In the above example, the ending best match will be <length=256, distance=259>, even though the starting location of the reference string was never indexed in the hash table structure and hash chain.

FIG. 1 illustrates an LZ77 architecture 100 according to some embodiments. In the architecture 100, multiple search engines, such as search engine 110, may be used. An input buffer 102 may contain data that is to be compressed. The input buffer 102 may be filled with part of a file or an entire file that will be compressed. The input buffer 102 may be used to fill both a lookahead buffer 114 and a history buffer 116. The lookahead buffer 114 may initially be filled from the input buffer 102 while the history buffer 116 is empty. As one or more search engines 110 process data in the lookahead buffer 114, the processed data may be moved to the history buffer 116. For example, in LZ77, the first byte to be compressed will always be treated as a literal with a length of 1 and may be moved to the history buffer 116.

Each search engine 110 may independently search the input bytes in the input buffer 102 or the lookahead buffer 114 against data in a history buffer 116. For example, a compare unit 118 may take one or more bytes from the input buffer 102 or the lookahead buffer 114 and search for the best match in the history buffer 116. A best match may mean the longest matching string that has the shortest distance from the current position. In other words, the longest and closet match. To help find matches, a hash table memory 106 and a spill table memory 108 may be accessed by a table updater 104 and/or a table walker 112. The table updater 104 updates the hash table memory 106 and potentially the spill table memory 108 based upon the input buffer 102. The table walker 112 provides the compare unit 118 with possible positions within the history buffer 116 to search for matches. In an example, the table walker 112 uses a hash of the first and/or the first and second bytes at the current position. This hash is used to lookup entries in the hash table memory 106 and the spill table memory 108. The table walker 112 may then be used to walk the various returned entries. The returned entries provide a pointer within the history buffer 116 that may contain matches. The compare unit 118 uses these pointers to find the best matches with the history buffer 116.

The history buffer 116 may also be referred as a sliding window of the input bytes. Each search engine 110 may be configured to search starting at a different byte position of the input file. Once a search engine 110 completes the search for a given position P, the search engine 110 may advance to position P+N, wherein N is the number of search engines 110. In an example, there are eight search engines 110. In such an example, one search engine 110 may start at byte 0, a second engine may start at byte 1, and so on. When each search engine 110 completes a search, the search engine 110 advances to position P+N, e.g., N is 8 in the current example.

The results from all search engines are input to a common logic unit called coalesce logic 120. The coalesce logic 120 examines the results from all the search engines 110 and chooses the result which produces the best compression ratio. The chosen result may then be written to an output 122, such as an output buffer, an output file, etc. To achieve high compression levels such as at level 9, the search results for all byte positions of the input file are examined to determine which positions result produces the best compression of the file. An example being a search at position P of the file produces a result of Length=10/Distance=5 and the search at position P+1 of the file produces Length=16/Distance=10. In this case it would be better to output a literal for position P followed by the Length/Distance pair for position P+1 rather than output the Length/Distance pair for position P.

In an example, the search engine 110 may use a hash table that is stored in the hash table memory 106 to identify locations in the history buffer 116 that are good candidates for the search engine 110 to compare for matches with the current position. The state of the hash table entry prior to the update may be defined as the "Hash Table Pre-Entry" for that location. The state of the hash table entry following the update may be defined as the "Hash Table Post Entry." An example hash table structure is shown below. Exemplary bit lengths and positions are indicated above each column.

| Table | 383 | 382-369 | 368-360 | 359 | 358-348 | 347-24 | 23-0 |
|---|---|---|---|---|---|---|---|
| Hash Table | Valid | Unused | Spill Count | Spill valid | Spill Table Pointer | Pointers (1-19) | Pointer 0 |

In an example, all pointers of all the hash table entries are initially reset to a null or an invalid state and the spill valid bit is reset to 0. For each update to a hash table entry the pointers from the Pre Entry are shifted one position and the new byte position is used as the pointer 0 value for the Post Entry. In the case where there is no more room to add a new pointer to the hash table entry, e.g., twenty pointers in the above example, the Hash Table Pre-Entry is written to the Spill Table memory. An example spill table entry is shown below and exemplary bit lengths and positions are indicated above each column.

| Table | 383 | 382-371 | 370-360 | 359 | 358-348 | 347-24 | 23-0 |
|---|---|---|---|---|---|---|---|
| Spill Table | Valid | Unused | Hash Table Index | Spill valid | Spill Table Pointer | Pointers (1-19) | Pointer 0 |

When an update results in a write to the spill table memory then pointer 0 of the Post Entry is written with the value of the new byte position, all other offset pointers of the Post Entry are written to a Null or Invalid state and the spill valid column is set to 1. The location into the Spill Table Memory where the new Spill Table Entry was written is saved as the Spill Index field of the Hash Table Post Entry.

In an example, an ASIC or a processor implements portions of the search engines 110, from FIG. 1, as part of an LZ77 implementation. For example, the compare unit 118, history buffer 116, and lookahead buffer 114 may be implemented on the ASIC. A DSP or field programmable array (FPGA) may be used to implementation the table walker 112, the coalesce logic 120, the spill table memory 108, the table updater 104, and the hash table memory 106. These components together implement optimizing the use of data runs. The LZ77 implementation may offload the table walking 112, the table updater 104, and the coalesce logic to achieve the optimizations as described herein. In other implementations, the table walker 112, table updater 104, and the coalesce logic 120 may be built into the LZ77 implementation. For example, an ASIC may implement the various components shown in FIG. 1. In another example, an LZ77 implementation may use a coprocessor, FPGA, or DSP, that implements the enhancement described herein. The LZ77 implementation may then call out to the coprocessor as part of the LZ77 implementation. As another example, the LZ77 implementation may be done on a processor, such as processor 700 in FIG. 7 or processors 970 in FIG. 9. In this example, the table walker 112, the coalesce logic 120 may be implemented on a special purpose processor, special purpose logic 708 or processor 980.

In an example, to achieve high compression levels such as DEFLATE Level 9 the architecture 100 may be configured to search or compare up to 192 pointer locations for each byte position of the input file. This is much lower than the 4K searches per position in zlib/gzip Level 9; however, the compression ratio is able to be met despite fewer searches due to better score functions, chain selection schemes, etc.

Using the search results from a previous byte of a run to calculate results for the successive bytes of the run may be implemented in the search engines 110. The effort the search engines 110 can spend traversing a long hash chain may exceed 100s of clock cycles for a byte position. Using the search results from a previous byte of a run may reduce the searching to only one clock cycle to perform the calculation for the byte positions that are part of a run.

Since more than one search engine 110 is used, each search engine 110 may perform a complete walk using the table walker 112 of the hash chain for the first byte that it processes which is part of run of literals, the same as it normally would for any other byte of the file. When a search engine 110 reaches the next byte position of the run an indication is sent to the search engine 110 that this byte position is a continuation of a run of literals. When the search engine 110 receives this indication the search engine 110 may calculate the result for the new byte position using the previous result. In the case where we have eight search engines 110 the new result would be calculated as Length=Previous Length−8 and Distance=Previous Distance. This means that full searches are done only on the first 8 positions of any run; while this is more effort than optimizing to just the first position, it enables an easier/scalable hardware design where the different parallel search cores do not need to cross-communicate with each other and merely forward their best run match onto their own future positions. In another example, only the first position is searched. In this example, the first search engine that finds the start of a run will communicate the indication of the run to each of the other search engines.

Figure 2:
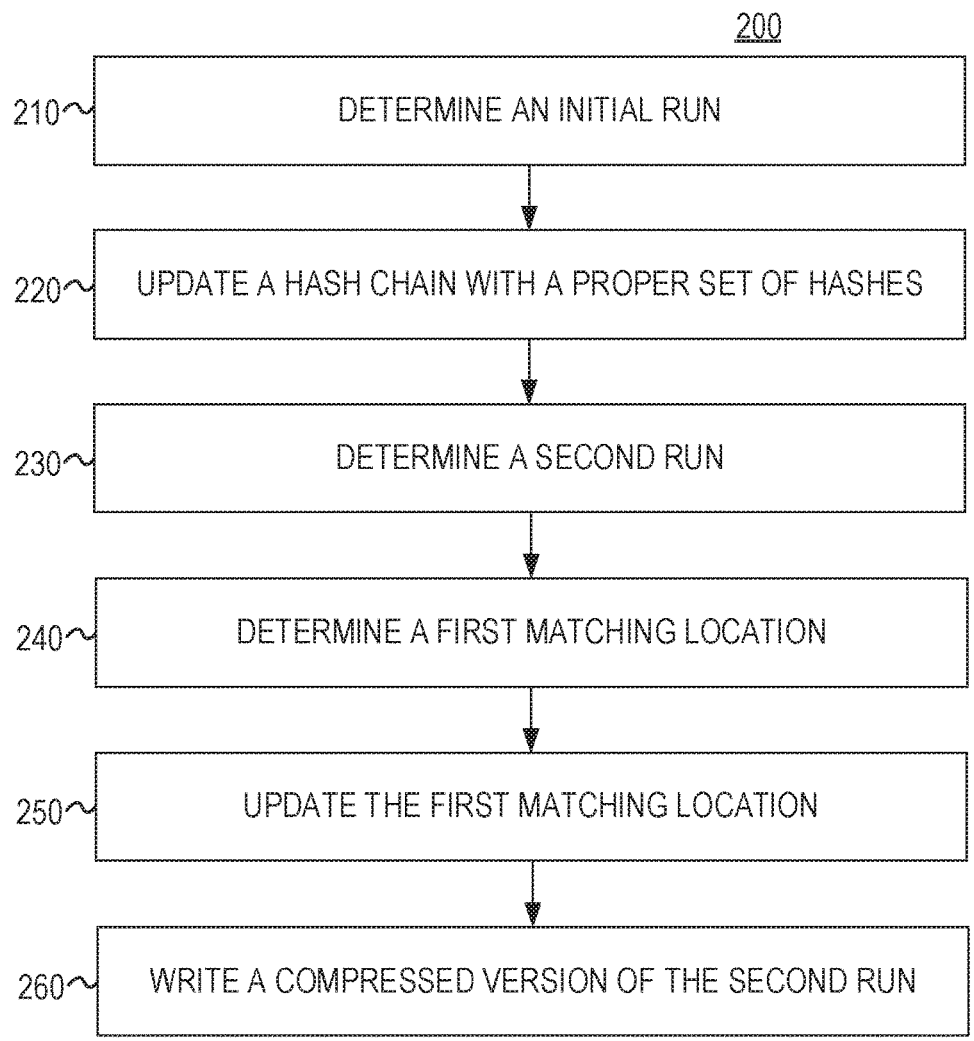
FIG. 2 is a flowchart showing one example of a process flow for compressing data according to some embodiments.

FIG. 2 is a flowchart showing one example of a process flow 200 for compressing data according to some embodiments. Input data may have a run of the same literal or literals that repeat a number of times. In an example, literals that repeat more than the number of search engines used within the system will count has a literal run that is handled differently than normal LZ77 handling. For example, if the run has eight or more literals, the literal run processing may be done. An initial run of a literal or literals is found in input data (operation 210). The initial run is a run of literals whose literal has not been previously found in the input data. The hash table and hash chain are updated for a proper subset of the initial run. Normally, each position within the run would be used to update the hash chain and the hash table. For repeating literals, the same input used to create a hash would be used, e.g., since the run is repeating literals the prefix for each position would be the same. Rather than updating the hash chain and hash table for each position, a proper subset of prefixes is used to create hashes and update the hash chain (operation 220). In an example, the size of the proper subset is equal to the number of search engines used to compress the input data.

While processing additional input data, a second run is found (operation 230). The second run has the same repeating literal as the initial run. In an example, the length of the second run is less than the initial run. Finding the second run, by a search engine using a compare unit, provides a first matching location (operation 240). The first matching location is the location in a history buffer that may be the start of the initial run. A distance value is also determined, which is the distance from the start of the second run to the matching location. Initially, the matching location is the start of the initial run. For example, the initial run may start 5,000 bytes from the second run. In this example, the initial run may be 1,000 bytes long and the second run may be 500 bytes long. The distance value would be 5,000 and the matching length would be 500. The distance, however, is not optimal since the distance could be 4,500 rather than 5,000. A smaller distance allows the distance value to be encoded using fewer bits. Some compression formats have a maximum allowed value for the length of the compare. For example, DEFLATE may have a maximum length of 258 bytes. With this maximum length value, the closest starting distance to the starting byte of the second run may be calculated as distance to the start of the first run−length of the first run+maximum length of the second run. In the above example, this would be 5,000−999+258=4,259.

The first matching location, therefore, may be updated from 5,000 to 4,500 (operation 250). In an example, the first matching location is updated by subtracting 1 and then checking the next byte to determine if the next byte continues with the matching literal from both the initial run and the second run. If there is a match, then the distance may be decremented by one and the literal check is done again. This repeats until the literal check indicates that the next byte is different than the literal in the run. At this point, the distance value is the smallest possible value. As noted above, multiple search engines may be run in parallel for different byte positions within the input data. The output from each search engine may be compared together to determine what is the optimal distance/length pair for each byte position. The matching location of the first run, the start of the second run, and the length of the second run may be written to an output buffer (operation 260). The output buffer, therefore, will contain a compressed version of the second run. The output buffer may be an output file or an in-memory buffer that may later be written to a file. In an example, once the process is completed an LZ77 compressed file is written to a storage medium or written to an operating system pipe.

The lossless semi-dynamic compression scheme has a number of applications. For example, web servers may compress web data to send to browsers that decompress the data. If a web server does not support compression, a proxy compression appliance in front of the web server can be used to serve compressed data. In addition, databases and storage components may compress the data prior to storing the data. As another example, compression can be added to various network stacks of various protocols, such as, TLS/SSL, to support transmission of compressed data.

Example Machine Description

Figure 3:
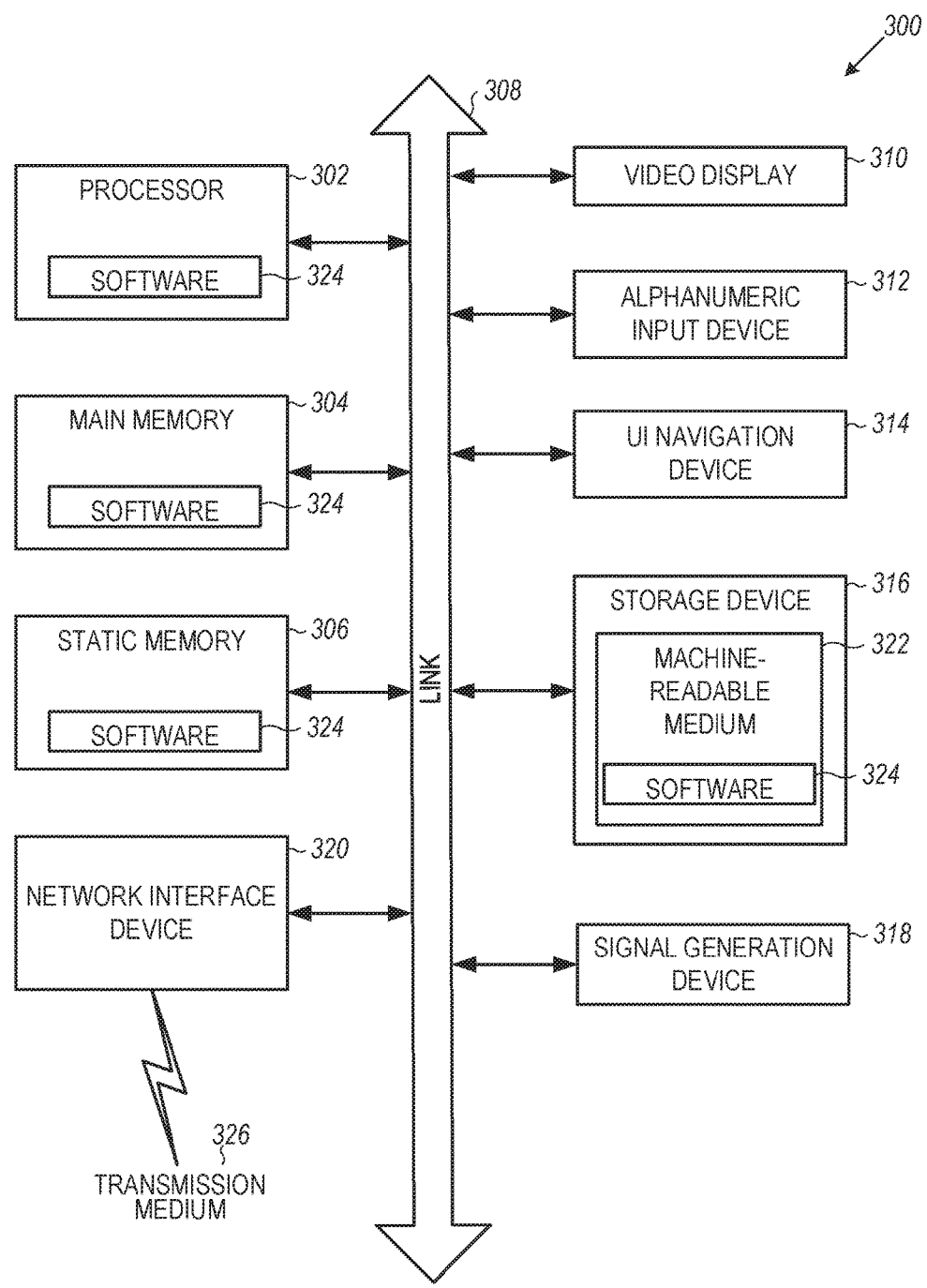
FIG. 3 illustrates a block diagram of a computing device, within which a set or sequence of instructions may be executed to cause the device to perform examples of any one of the methodologies discussed herein.

FIG. 3 illustrates a block diagram of computing device 300, within which a set or sequence of instructions may be executed to cause the device to perform examples of any one of the methodologies discussed herein. In alternative embodiments, the machine 300 may operate as a standalone device or may be connected (e.g., networked) to other machines. In a networked deployment, the machine 300 may operate in the capacity of a server machine, a client machine, or both in server-client network environments. In an example, the machine 300 may act as a peer machine in peer-to-peer (P2P) (or other distributed) network environment. The machine 300 may be a user equipment (UE), evolved Node B (eNB), Wi-Fi access point (AP), Wi-Fi station (STA), personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 300 may include a hardware processor 302 (e.g., a central processing unit (CPU), a graphics processing unit (GPU), a hardware processor core, or any combination thereof), a main memory 304 and a static memory 306, some or all of which may communicate with each other via an interlink (e.g., bus) 308. The machine 300 may further include a display unit 310, an alphanumeric input device 312 (e.g., a keyboard), and a user interface (UI) navigation device 314 (e.g., a mouse). In an example, the display unit 310, input device 312 and UI navigation device 314 may be a touch screen display. The machine 300 may additionally include a storage device (e.g., drive unit) 316, a signal generation device 318 (e.g., a speaker), a network interface device 320, and one or more sensors, such as a global positioning system (GPS) sensor, compass, accelerometer, or other sensor. The machine 300 may include an output controller 328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 316 may include a machine readable medium 322 on which is stored one or more sets of data structures or instructions 324 (e.g., software) embodying or utilized by any one or more of the techniques or functions described herein. The instructions 324 may also reside, completely or at least partially, within the main memory 304, within static memory 306, or within the hardware processor 302 during execution thereof by the machine 300. In an example, one or any combination of the hardware processor 302, the main memory 304, the static memory 306, or the storage device 316 may constitute machine readable media.

While the machine readable medium 322 is illustrated as a single medium, the term "machine readable medium" may include a single medium or multiple media (e.g., a centralized or distributed database, and/or associated caches and servers) configured to store the one or more instructions 324.

The term "machine readable medium" may include any medium that is capable of storing, encoding, or carrying instructions for execution by the machine 300 and that cause the machine 300 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 324 may further be transmitted or received over a communications network 326 using a transmission medium via the network interface device 320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. In some examples, the network interface device 520 may wirelessly communicate using Multiple User MIMO techniques. The term "transmission medium" shall be taken to include any intangible medium that is capable of storing, encoding or carrying instructions for execution by the machine 500, and includes digital or analog communications signals or other intangible medium to facilitate communication of such software.

Additional Notes and Examples

Example 1 is a system for compressing data using LZ77 compression, the system comprising: a first search engine to determine an initial run from input data, the initial run comprising repeating data at a first location, the initial run having a first length; a table updater to update a hash chain with a proper set of hashes from prefixes from the initial run; the first search engine to: determine a second run comprising the repeating data at a second location, the second run having a second length less than the first length; and determine a first matching location within the input data having the repeating data using the hash chain and the second run, the first matching location being the first location; and coalesce logic to write the first matching location, the second location, and the second length to an output buffer, the output buffer comprising a compressed version of the second run.

In Example 2, the subject matter of Example 1 includes, the first search engine to update the first matching location based on the second location, the second length, and the first location.

In Example 3, the subject matter of Examples 1-2 includes, a second search engine to find a second matching location within the input data having the repeating data.

In Example 4, the subject matter of Example 3 includes, the coalesce logic to select the first matching location over the second matching location.

In Example 5, the subject matter of Examples 3-4 includes, the coalesce logic to select the first matching location over the second matching location based on the second length.

In Example 6, the subject matter of Examples 3-5 includes, a size of the proper set of prefixes equal to a number of search engines used to compress the input data.

In Example 7, the subject matter of Example 6 includes, the size of the proper set is eight.

In Example 8, the subject matter of Examples 3-7 includes, the coalesce logic to select matching locations from the search engines to compress the input data.

In Example 9, the subject matter of Examples 3-8 includes, the first search engine and the second search engine ran in parallel.

In Example 10, the subject matter of Examples 1-9 includes, the repeating data is a literal.

Example 11 is a machine-implemented method for compressing data using LZ77 compression, the method comprising: determining an initial run from input data, the initial run comprising repeating data at a first location, the initial run having a first length; updating a hash chain with a proper set of hashes from prefixes from the initial run, determining, using a first search engine, a second run comprising the repeating data at a second location, the second run having a second length less than the first length; determining a first matching location within the input data having the repeating data using the hash chain and the second run, the first matching location being the first location; and writing the first matching location, the second location, and the second length to an output buffer, the output buffer comprising a compressed version of the second run.

In Example 12, the subject matter of Example 11 includes, updating the first matching location based on the second location, the second length, and the first location.

In Example 13, the subject matter of Examples 11-12 includes, finding, using a second search engine, a second matching location within the input data having the repeating data.

In Example 14, the subject matter of Example 13 includes, selecting the first matching location over the second matching location based on the second length.

In Example 15, the subject matter of Examples 13-14 includes, a size of the proper set of prefixes equal to a number of search engines used to compress the input data.

In Example 16, the subject matter of Example 15 includes, the size of the proper set is eight.

In Example 17, the subject matter of Examples 13-16 includes, selecting matching locations from the search engines to compress the input data.

In Example 18, the subject matter of Examples 13-17 includes, the first search engine and the second search engine ran in parallel.

In Example 19, the subject matter of Examples 11-18 includes, the repeating data is a literal.

Example 20 is at least one computer-readable medium, including instructions, which when executed by a machine, cause the machine to perform operations for compressing data using LZ77 compression, the operations comprising: determining an initial run from input data, the initial run comprising repeating data at a first location, the initial run having a first length; updating a hash chain with a proper set of hashes from prefixes from the initial run; determining, using a first search engine, a second run comprising the repeating data at a second location, the second run having a second length less than the first length; determining a first matching location within the input data having the repeating data using the hash chain and the second run, the first matching location being the first location; and writing the first matching location, the second location, and the second length to an output buffer, the output buffer comprising a compressed version of the second run.

In Example 21, the subject matter of Example 20 includes, wherein the operations further comprise updating the first matching location based on the second location, the second length, and the first location.

In Example 22, the subject matter of Examples 20-21 includes, wherein the operations further comprise finding, using a second search engine, a second matching location within the input data having the repeating data.

In Example 23, the subject matter of Example 22 includes, wherein the operations further comprise selecting the first matching location over the second matching location based on the second length.

In Example 24, the subject matter of Examples 22-23 includes, a size of the proper set of prefixes equal to a number of search engines used to compress the input data.

In Example 25, the subject matter of Example 24 includes, the size of the proper set is eight.

In Example 26, the subject matter of Examples 22-25 includes, wherein the operations further comprise selecting matching locations from the search engines to compress the input data.

In Example 27, the subject matter of Examples 22-26 includes, the first search engine and the second search engine ran in parallel.

In Example 28, the subject matter of Examples 20-27 includes, the repeating data is a literal.

Example 29 is an apparatus for compressing data using LZ77 compression, the apparatus comprising: means for determining an initial run from input data, the initial run comprising repeating data at a first location, the initial run having a first length; means for updating a hash chain with a proper set of hashes from prefixes from the initial run; means for determining, using a first search engine, a second run comprising the repeating data at a second location, the second run having a second length less than the first length; means for determining a first matching location within the input data having the repeating data using the hash chain and the second run, the first matching location being the first location; and means for writing the first matching location, the second location, and the second length to an output buffer, the output buffer comprising a compressed version of the second run.

In Example 30, the subject matter of Example 29 includes, means for updating the first matching location based on the second location, the second length, and the first location.

In Example 31, the subject matter of Examples 29-30 includes, means for finding, using a second search engine, a second matching location within the input data having the repeating data.

In Example 32, the subject matter of Example 31 includes, means for selecting the first matching location over the second matching location based on the second length.

In Example 33, the subject matter of Examples 31-32 includes, a size of the proper set of prefixes equal to a number of search engines used to compress the input data.

In Example 34, the subject matter of Example 33 includes, the size of the proper set is eight.

In Example 35, the subject matter of Examples 31-34 includes, means for selecting matching locations from the search engines to compress the input data.

In Example 36, the subject matter of Examples 31-35 includes, the first search engine and the second search engine ran in parallel.

In Example 37, the subject matter of Examples 29-36 includes, the repeating data is a literal.

Example 38 is at least one machine-readable medium including instructions, which when executed by a machine, cause the machine to perform operations of any of the operations of Examples 11-19.

Example 39 is an apparatus comprising means for performing any of the operations of Examples 11-19.

Example 40 is at least one machine-readable medium including instructions that, when executed by processing circuitry, cause the processing circuitry to perform operations to implement of any of Examples 1-39.

Example 41 is an apparatus comprising means to implement of any of Examples 1-39.

Example 42 is a system to implement of any of Examples 1-39.

Example 43 is a method to implement of any of Examples 1-39.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect. An example LTE system includes a number of mobile stations, defined by the LTE specification as User Equipment (UE), communicating with a base station, defined by the LTE specifications as an eNB.

Antennas referred to herein may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $1/10$ of a wavelength or more.

In some embodiments, a receiver as described herein may be configured to receive signals in accordance with specific communication standards, such as the Institute of Electrical and Electronics Engineers (IEEE) standards including IEEE 802.11 standards and/or proposed specifications for WLANs, although the scope of the disclosure is not limited in this respect as they may also be suitable to transmit and/or receive communications in accordance with other techniques and standards. In some embodiments, the receiver may be configured to receive signals in accordance with the IEEE 802.16-2004, the IEEE 802.16(e) and/or IEEE 802.16 (m) standards for wireless metropolitan area networks (WMANs) including variations and evolutions thereof, although the scope of the disclosure is not limited in this respect as they may also be suitable to transmit and/or receive communications in accordance with other techniques and standards. In some embodiments, the receiver may be configured to receive signals in accordance with the Universal Terrestrial Radio Access Network (UTRAN) LTE communication standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions. For more information with respect to UTRAN LTE standards, see the 3rd Generation Partnership Project (3GPP) standards for UTRAN-LTE, including variations and evolutions thereof.

Exemplary Register Architecture

Figure 4:
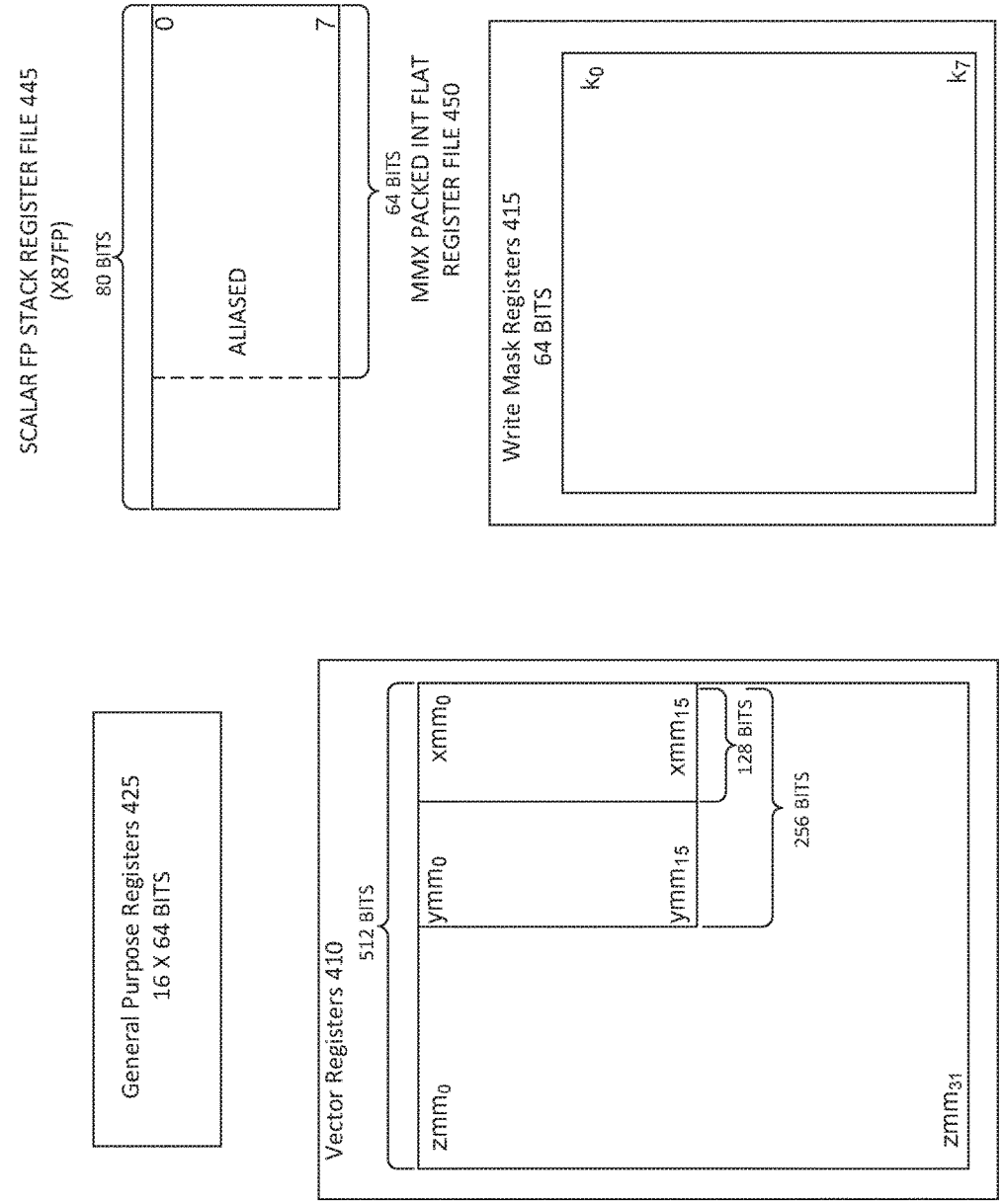
FIG. 4 is a block diagram of a register architecture according to one embodiment of the invention.

FIG. 4 is a block diagram of a register architecture 400 according to one embodiment of the invention. In the embodiment illustrated, there are 32 vector registers 410 that are 412 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15.

Write mask registers 415—in the embodiment illustrated, there are 8 write mask registers (k0 through k7), each 64 bits in size. In an alternate embodiment, the write mask registers 415 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 425—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 445, on which is aliased the MMX packed integer flat register file 450—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 5A is a block diagram illustrating both an exemplary in-order pipeline and an exemplary register renaming, out-of-order issue/execution pipeline according to embodiments of the invention. FIG. 5B is a block diagram illustrating both an exemplary embodiment of an in-order architecture core and an exemplary register renaming, out-of-order issue/execution architecture core to be included in a processor according to embodiments of the invention. The solid lined boxes in FIGS. 5A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 5A, a processor pipeline 500 includes a fetch stage 502, a length decode stage 504, a decode stage 506, an allocation stage 508, a renaming stage 510, a scheduling (also known as a dispatch or issue) stage 512, a register read/memory read stage 514, an execute stage 516, a write back/memory write stage 518, an exception handling stage 522, and a commit stage 524.

FIG. 5B shows processor core 590 including a front end unit 530 coupled to an execution engine unit 550, and both are coupled to a memory unit 570. The core 590 may be a reduced instruction set computing (RISC) core, a complex instruction set computing (CISC) core, a very long instruction word (VLIW) core, or a hybrid or alternative core type. As yet another option, the core 590 may be a special-purpose core, such as, for example, a network or communication core, compression engine, coprocessor core, general purpose computing graphics processing unit (GPGPU) core, graphics core, or the like.

The front end unit 530 includes a branch prediction unit 532 coupled to an instruction cache unit 534, which is coupled to an instruction translation lookaside buffer (TLB) 536, which is coupled to an instruction fetch unit 538, which is coupled to a decode unit 540. The decode unit 540 (or decoder) may decode instructions, and generate as an output one or more micro-operations, micro-code entry points, microinstructions, other instructions, or other control signals, which are decoded from, or which otherwise reflect, or are derived from, the original instructions. The decode unit 540 may be implemented using various different mechanisms. Examples of suitable mechanisms include, but are not limited to, lookup tables, hardware implementations, programmable logic arrays (PLAs), microcode read only memories (ROMs), etc. In one embodiment, the core 590 includes a microcode ROM or other medium that stores microcode for certain macroinstructions (e.g., in decode unit 540 or otherwise within the front end unit 530). The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations, central instruction window, etc. The scheduler unit(s) 556 is coupled to the physical register file(s) unit(s) 558. Each of the physical register file(s) units 558 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 558 comprises a vector registers unit, a write mask registers unit, and a scalar registers unit. These register units may provide architectural vector registers, vector mask registers, and general purpose registers. The physical register file(s) unit(s) 558 is overlapped by the retirement unit 554 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 556, physical register file(s) unit(s) 558, and execution cluster(s) 560 are shown as being possibly plural because certain embodiments create separate pipelines for certain types of data/operations (e.g., a scalar integer pipeline, a scalar floating point/packed integer/packed floating point/ vector integer/vector floating point pipeline, and/or a memory access pipeline that each have their own scheduler unit, physical register file(s) unit, and/or execution cluster— and in the case of a separate memory access pipeline, certain embodiments are implemented in which only the execution cluster of this pipeline has the memory access unit(s) 564). It should also be understood that where separate pipelines are used, one or more of these pipelines may be out-of-order issue/execution and the rest in-order.

The set of memory access units 564 is coupled to the memory unit 570, which includes a data TLB unit 572 coupled to a data cache unit 574 coupled to a level 2 (L2) cache unit 576. In one exemplary embodiment, the memory access units 564 may include a load unit, a store address unit, and a store data unit, each of which is coupled to the data TLB unit 572 in the memory unit 570. The instruction cache unit 534 is further coupled to a level 2 (L2) cache unit 576 in the memory unit 570. The L2 cache unit 576 is coupled to one or more other levels of cache and eventually to a main memory.

By way of example, the exemplary register renaming, out-of-order issue/execution core architecture may implement the pipeline 500 as follows: 1) the instruction fetch 538 performs the fetch and length decoding stages 502 and 504; 2) the decode unit 540 performs the decode stage 506; 3) the rename/allocator unit 552 performs the allocation stage 508 and renaming stage 510; 4) the scheduler unit(s) 556 performs the schedule stage 512; 5) the physical register file(s) unit(s) 558 and the memory unit 570 perform the register read/memory read stage 514; the execution cluster 560 perform the execute stage 516; 6) the memory unit 570 and the physical register file(s) unit(s) 558 perform the write back/memory write stage 518; 7) various units may be involved in the exception handling stage 522; and 8) the retirement unit 554 and the physical register file(s) unit(s) 558 perform the commit stage 524.

The core 590 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 590 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 534/574 and a shared L2 cache unit 576, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 6B:
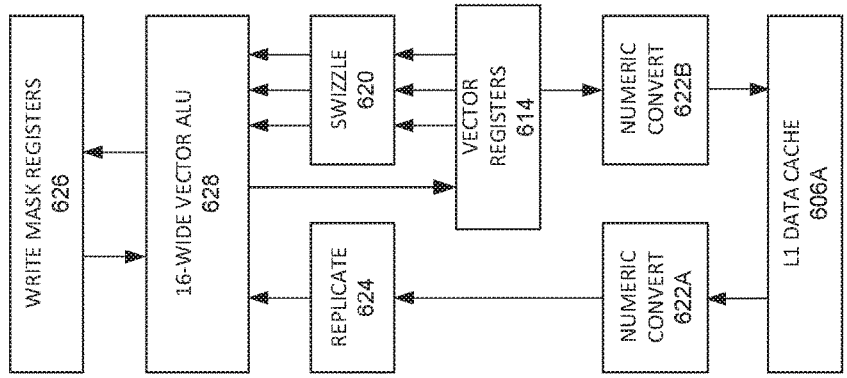
FIGS. 6A-6B illustrate a block diagram of a more specific exemplary in-order core architecture, which core would be one of several logic blocks (including other cores of the same type and/or different types) in a chip.
Figure 6A:
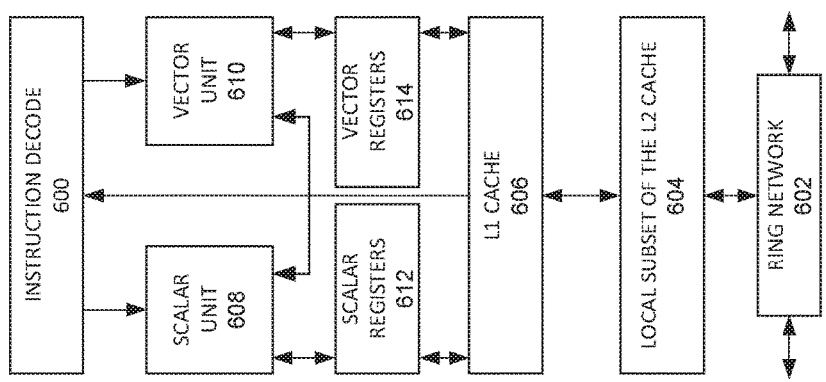

FIGS. 6A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 6A is a block diagram of a single processor core, along with its connection to the on-die interconnect network 602 and with its local subset of the Level 2 (L2) cache 604, according to embodiments of the invention. In one embodiment, an instruction decoder 600 supports the x86 instruction set with a packed data instruction set extension. An L1 cache 606 allows low-latency accesses to cache memory into the scalar and vector units. While in one embodiment (to simplify the design), a scalar unit 608 and a vector unit 610 use separate register sets (respectively, scalar registers 612 and vector registers 614) and data transferred between them is written to memory and then read back in from a level 1 (L1) cache 606, alternative embodiments of the invention may use a different approach (e.g., use a single register set or include a communication path that allow data to be transferred between the two register files without being written and read back).

The local subset of the L2 cache 604 is part of a global L2 cache that is divided into separate local subsets, one per processor core. Each processor core has a direct access path to its own local subset of the L2 cache 604. Data read by a processor core is stored in its L2 cache subset 604 and can be accessed quickly, in parallel with other processor cores accessing their own local L2 cache subsets. Data written by a processor core is stored in its own L2 cache subset 604 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 6B is an expanded view of part of the processor core in FIG. 6A according to embodiments of the invention. FIG. 6B includes an L1 data cache 606A part of the L1 cache 604, as well as more detail regarding the vector unit 610 and the vector registers 614. Specifically, the vector unit 610 is a 16-wide vector processing unit (VPU) (see the 16-wide ALU 628), which executes one or more of integer, single-precision float, and double-precision float instructions. The VPU supports swizzling the register inputs with swizzle unit 620, numeric conversion with numeric convert units 622A-B, and replication with replication unit 624 on the memory input. Write mask registers 626 allow predicating resulting vector writes.

Figure 7:
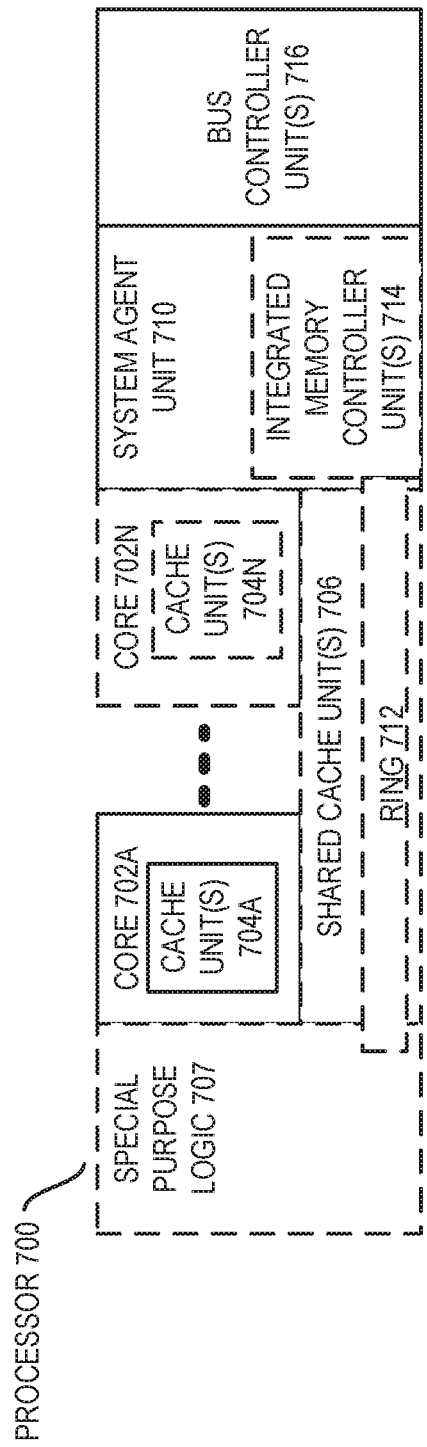
FIG. 7 is a block diagram of a processor that may have more than one core, may have an integrated memory controller, and may have integrated graphics according to embodiments of the invention.

FIG. 7 is a block diagram of a processor 700 that may have more than one core, may have an integrated memory controller, and may have integrated graphics according to embodiments of the invention. The solid lined boxes in FIG. 7 illustrate a processor 700 with a single core 702A, a system agent 710, a set of one or more bus controller units 716, while the optional addition of the dashed lined boxes illustrates an alternative processor 700 with multiple cores 702A-N, a set of one or more integrated memory controller unit(s) 714 in the system agent unit 710, and special purpose logic 708.

Thus, different implementations of the processor 700 may include: 1) a CPU with the special purpose logic 708 being integrated graphics and/or scientific (throughput) logic (which may include one or more cores), and the cores 702A-N being one or more general purpose cores (e.g., general purpose in-order cores, general purpose out-of-order cores, a combination of the two); 2) a coprocessor with the cores 702A-N being a large number of special purpose cores intended primarily for graphics and/or scientific (throughput); and 3) a coprocessor with the cores 702A-N being a large number of general purpose in-order cores. Thus, the processor 700 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 700 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 706, and external memory (not shown) coupled to the set of integrated memory controller units 714. The set of shared cache units 706 may include one or more mid-level caches, such as level 2 (L2), level 3 (L3), level 4 (L4), or other levels of cache, a last level cache (LLC), and/or combinations thereof. While in one embodiment a ring based interconnect unit 712 interconnects the integrated graphics logic 708, the set of shared cache units 706, and the system agent unit 710/integrated memory controller unit(s) 714, alternative embodiments may use any number of well-known techniques for interconnecting such units. In one embodiment, coherency is maintained between one or more cache units 706 and cores 702-A-N.

In some embodiments, one or more of the cores 702A-N are capable of multi-threading. The system agent 710 includes those components coordinating and operating cores 702A-N. The system agent unit 710 may include for example a power control unit (PCU) and a display unit. The PCU may be or include logic and components needed for regulating the power state of the cores 702A-N and the integrated graphics logic 708. The display unit is for driving one or more externally connected displays.

The cores 702A-N may be homogenous or heterogeneous in terms of architecture instruction set; that is, two or more of the cores 702A-N may be capable of execution the same instruction set, while others may be capable of executing only a subset of that instruction set or a different instruction set.

Exemplary Computer Architectures

FIGS. 8-12 are block diagrams of exemplary computer architectures.

Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 8:
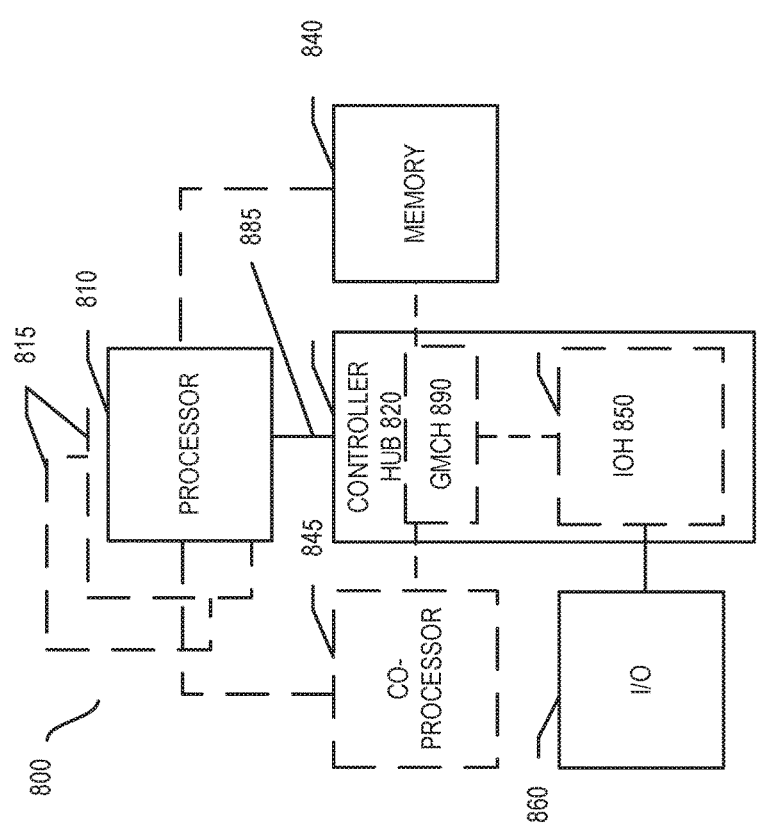
FIGS. 8-11 are block diagrams of exemplary computer architectures.

Referring now to FIG. 8, shown is a block diagram of a system 800 in accordance with one embodiment of the present invention. The system 800 may include one or more processors 810, 815, which are coupled to a controller hub 820. In one embodiment the controller hub 820 includes a graphics memory controller hub (GMCH) 890 and an Input/Output Hub (IOH) 850 (which may be on separate chips); the GMCH 890 includes memory and graphics controllers to which are coupled memory 840 and a coprocessor 845; the IOH 850 is couples input/output (I/O) devices 860 to the GMCH 890. Alternatively, one or both of the memory and graphics controllers are integrated within the processor (as described herein), the memory 840 and the coprocessor 845 are coupled directly to the processor 810, and the controller hub 820 in a single chip with the IOH 850.

The optional nature of additional processors 815 is denoted in FIG. 8 with broken lines. Each processor 810, 815 may include one or more of the processing cores described herein and may be some version of the processor 700.

The memory 840 may be, for example, dynamic random access memory (DRAM), phase change memory (PCM), or a combination of the two. For at least one embodiment, the controller hub 820 communicates with the processor(s) 89, 815 via a multi-drop bus, such as a frontside bus (FSB), point-to-point interface such as QuickPath Interconnect (QPI), or similar connection 895.

In one embodiment, the coprocessor 845 is a special-purpose processor, such as, for example, a high-throughput MIC processor, a network or communication processor, compression engine, graphics processor, GPGPU, embedded processor, or the like. In one embodiment, controller hub 820 may include an integrated graphics accelerator.

There can be a variety of differences between the physical resources 810, 815 in terms of a spectrum of metrics of merit including architectural, microarchitectural, thermal, power consumption characteristics, and the like.

In one embodiment, the processor 810 executes instructions that control data processing operations of a general type. Embedded within the instructions may be coprocessor instructions. The processor 810 recognizes these coprocessor instructions as being of a type that should be executed by the attached coprocessor 845. Accordingly, the processor 810 issues these coprocessor instructions (or control signals representing coprocessor instructions) on a coprocessor bus or other interconnect, to coprocessor 845. Coprocessor(s) 845 accept and execute the received coprocessor instructions.

Figure 9:
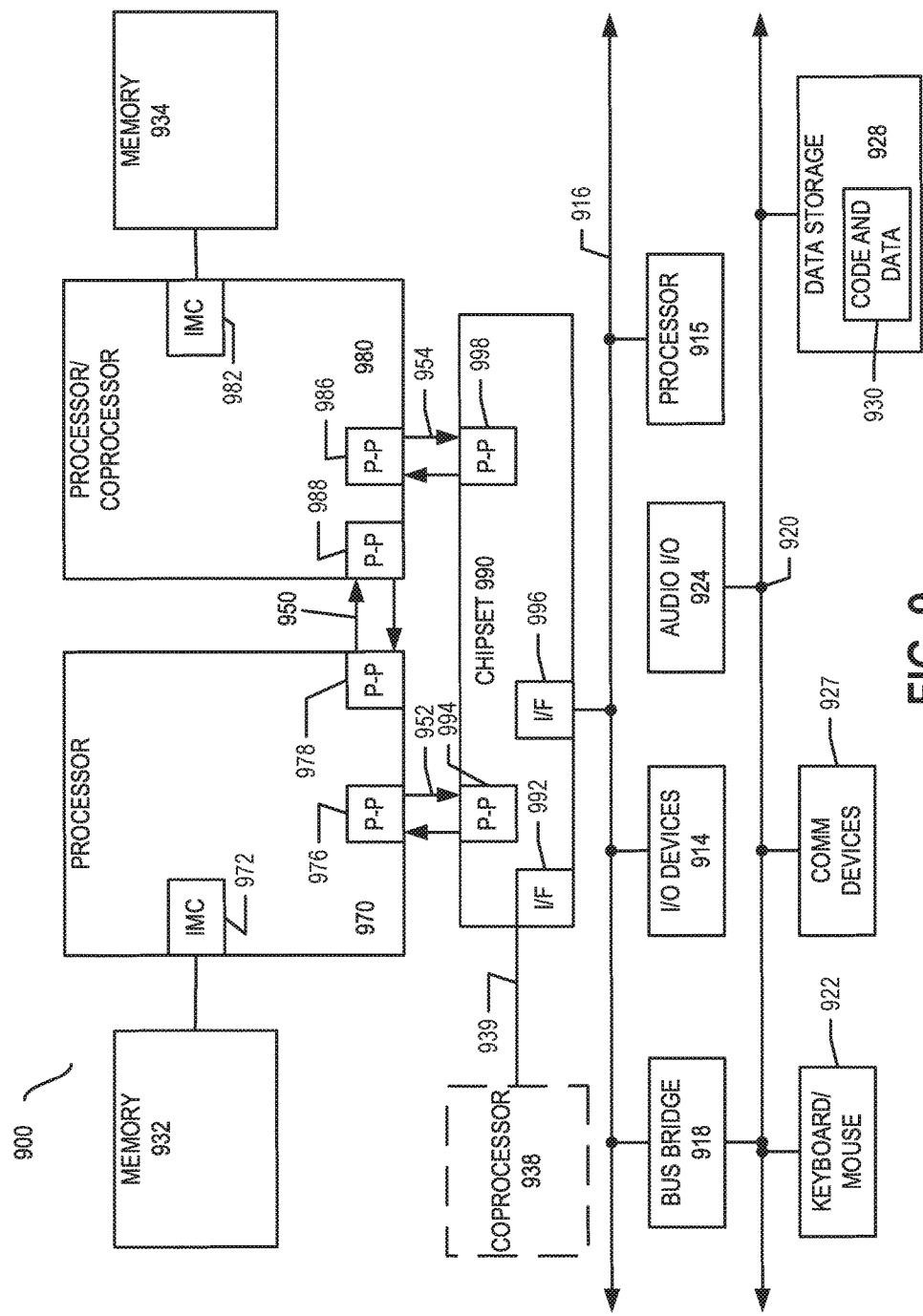

Referring now to FIG. 9, shown is a block diagram of a first more specific exemplary system 900 in accordance with an embodiment of the present invention. As shown in FIG. 9, multiprocessor system 900 is a point-to-point interconnect system, and includes a first processor 970 and a second processor 980 coupled via a point-to-point interconnect 950. Each of processors 970 and 980 may be some version of the processor 800. In one embodiment of the invention, processors 970 and 980 are respectively processors 810 and 815, while coprocessor 938 is coprocessor 845. In another embodiment, processors 970 and 980 are respectively processor 810 coprocessor 845.

Processors 970 and 980 are shown including integrated memory controller (IMC) units 972 and 982, respectively. Processor 970 also includes as part of its bus controller units point-to-point (P-P) interfaces 976 and 978; similarly, second processor 980 includes P-P interfaces 986 and 988. Processors 970, 980 may exchange information via a point-to-point (P-P) interface 950 using P-P interface circuits 978, 988. As shown in FIG. 9, IMCs 972 and 982 couple the processors to respective memories, namely a memory 932 and a memory 934, which may be portions of main memory locally attached to the respective processors.

Processors 970, 980 may each exchange information with a chipset 990 via individual P-P interfaces 952, 954 using point to point interface circuits 976, 994, 986, 998. Chipset 990 may optionally exchange information with the coprocessor 938 via a high-performance interface 939. In one embodiment, the coprocessor 938 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 990 may be coupled to a first bus 916 via an interface 996. In one embodiment, first bus 916 may be a Peripheral Component Interconnect (PCI) bus, or a bus such as a PCI Express bus or another third generation I/O interconnect bus, although the scope of the present invention is not so limited.

As shown in FIG. 9, various I/O devices 914 may be coupled to first bus 916, along with a bus bridge 918 which couples first bus 916 to a second bus 920. In one embodiment, one or more additional processor(s) 915, such as coprocessors, high-throughput MIC processors, GPGPU's, accelerators (such as, e.g., graphics accelerators or digital signal processing (DSP) units), field programmable gate arrays, or any other processor, are coupled to first bus 916. In one embodiment, second bus 920 may be a low pin count (LPC) bus. Various devices may be coupled to a second bus 920 including, for example, a keyboard and/or mouse 922, communication devices 927 and a storage unit 928 such as a disk drive or other mass storage device which may include instructions/code and data 930, in one embodiment. Further, an audio I/O 924 may be coupled to the second bus 920. Note that other architectures are possible. For example, instead of the point-to-point architecture of FIG. 9, a system may implement a multi-drop bus or other such architecture.

Figure 10:
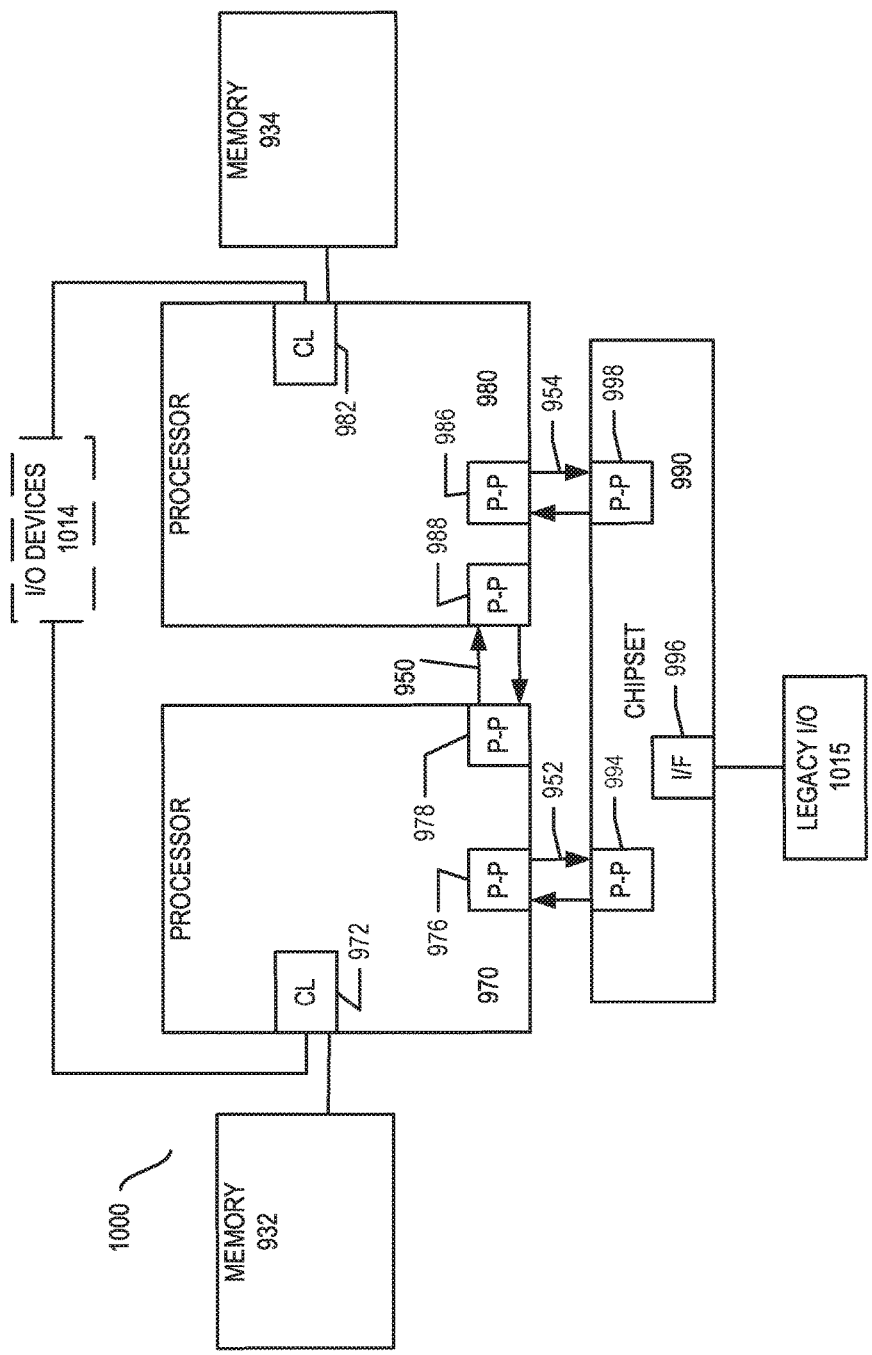

Referring now to FIG. 10, shown is a block diagram of a second more specific exemplary system 1000 in accordance with an embodiment of the present invention. Like elements in FIGS. 9 and 10 bear like reference numerals, and certain aspects of FIG. 9 have been omitted from FIG. 10 in order to avoid obscuring other aspects of FIG. 10.

FIG. 10 illustrates that the processors 970, 980 may include integrated memory and I/O control logic ("CL") 972 and 982, respectively. Thus, the CL 972, 982 include integrated memory controller units and include I/O control logic. FIG. 10 illustrates that not only are the memories 932, 934 coupled to the CL 972, 982, but also that I/O devices 1014 are also coupled to the control logic 972, 982. Legacy I/O devices 1015 are coupled to the chipset 990.

Figure 11:
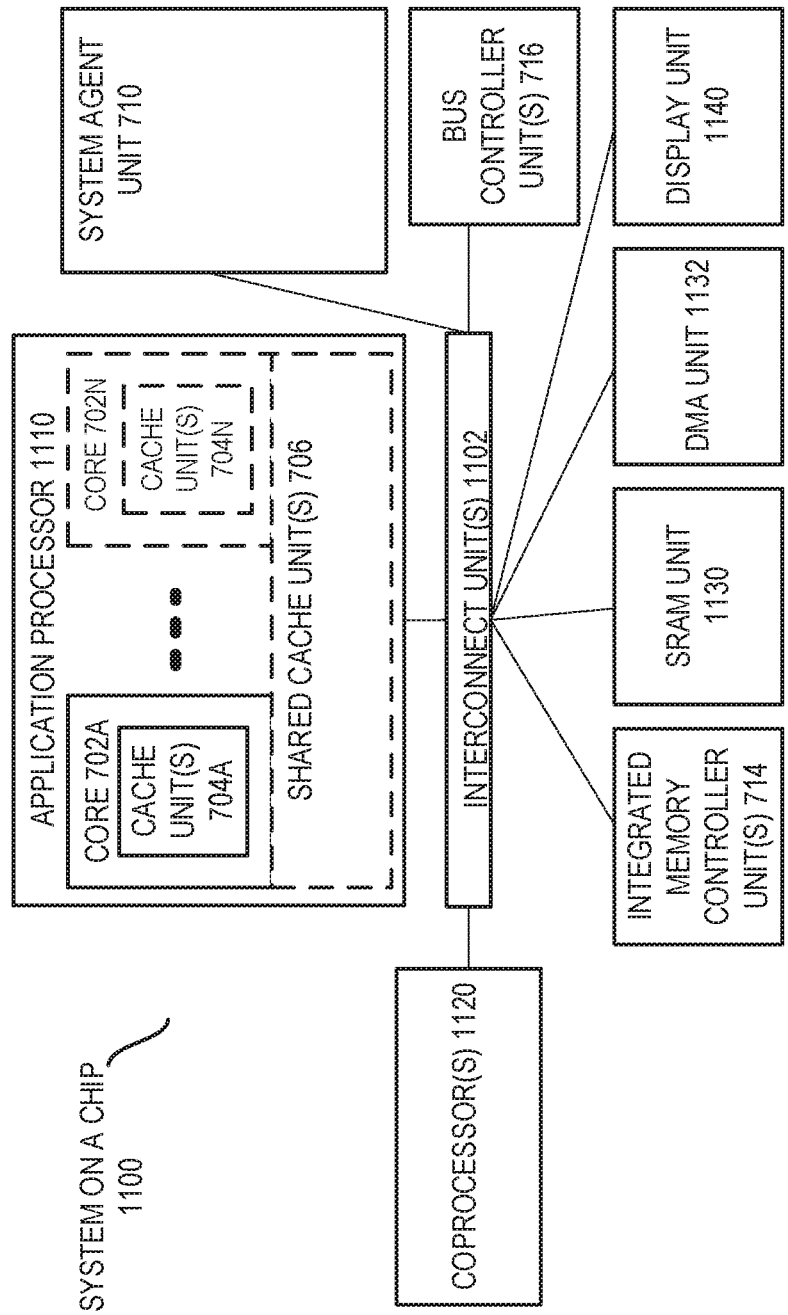

Referring now to FIG. 11, shown is a block diagram of a SoC 1100 in accordance with an embodiment of the present invention. Similar elements in FIG. 8 bear like reference numerals. Also, dashed lined boxes are optional features on more advanced SoCs. In FIG. 11, an interconnect unit(s) 1102 is coupled to: an application processor 1110 which includes a set of one or more cores 202A-N and shared cache unit(s) 706; a system agent unit 710; a bus controller unit(s) 716; an integrated memory controller unit(s) 714; a set or one or more coprocessors 1120 which may include integrated graphics logic, an image processor, an audio processor, and a video processor; an static random access memory (SRAM) unit 1130; a direct memory access (DMA) unit 1132; and a display unit 1140 for coupling to one or more external displays. In one embodiment, the coprocessor(s) 1120 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 12 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 12 shows a program in a high level language 1202 may be compiled using an x86 compiler 1204 to generate x86 binary code 1206 that may be natively executed by a processor with at least one x86 instruction set core 1216. The processor with at least one x86 instruction set core 1216 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1204 represents a compiler that is operable to generate x86 binary code 1206 (e.g., object code) that can, with or without additional linkage processing, be executed on the processor with at least one x86 instruction set core 1216. Similarly, FIG. 12 shows the program in the high level language 1202 may be compiled using an alternative instruction set compiler 1208 to generate alternative instruction set binary code 1210 that may be natively executed by a processor without at least one x86 instruction set core 1214 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1212 is used to convert the x86 binary code 1206 into code that may be natively executed by the processor without an x86 instruction set core 1214. This converted code is not likely to be the same as the alternative instruction set binary code 1210 because an instruction converter capable of this is difficult to make; however, the converted code will accomplish the general operation and be made up of instructions from the alternative instruction set. Thus, the instruction converter 1212 represents software, firmware, hardware, or a combination thereof that, through emulation, simulation or any other process, allows a processor or other electronic device that does not have an x86 instruction set processor or core to execute the x86 binary code 1206.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A system for compressing data using LZ77 compression, the system comprising:
   a first search engine to determine an initial run from input data, the initial run comprising repeating data at a first location, the initial run having a first length;
   a table updater to update a hash chain with a proper set of hashes from prefixes from the initial run;
   the first search engine to:
      determine a second run comprising the repeating data at a second location, the second run having a second length less than the first length; and
      determine a first matching location within the input data having the repeating data using the hash chain and the second run, the first matching location being the first location; and
   coalesce logic to write the first matching location, the second location, and the second length to an output buffer, the output buffer comprising a compressed version of the second run.

2. The system of claim 1, the first search engine to update the first matching location based on the second location, the second length, and the first location.

3. The system of claim 1, further comprising a second search engine to find a second matching location within the input data having the repeating data.

4. The system of claim 3, the coalesce logic to select the first matching location over the second matching location.

5. The system of claim 3, the coalesce logic to select the first matching location over the second matching location based on the second length.

6. The system of claim 3, a size of the proper set of prefixes equal to a number of search engines used to compress the input data.

7. The system of claim 6, the size of the proper set is eight.

8. The system of claim 3, the coalesce logic to select matching locations from the search engines to compress the input data.

9. The system of claim 3, the first search engine and the second search engine ran in parallel.

10. The system of claim 1, the repeating data is a literal.

11. A machine-implemented method for compressing data using LZ77 compression, the method comprising:
    determining an initial run from input data, the initial run comprising repeating data at a first location, the initial run having a first length;
    updating a hash chain with a proper set of hashes from prefixes from the initial run;
    determining, using a first search engine, a second run comprising the repeating data at a second location, the second run having a second length less than the first length;
    determining a first matching location within the input data having the repeating data using the hash chain and the second run, the first matching location being the first location; and
    writing the first matching location, the second location, and the second length to an output buffer, the output buffer comprising a compressed version of the second run.

12. The method of claim 11, further comprising updating the first matching location based on the second location, the second length, and the first location.

13. The method of claim 11, further comprising finding, using a second search engine, a second matching location within the input data having the repeating data.

14. The method of claim 13, selecting the first matching location over the second matching location based on the second length.

15. The method of claim 13, a size of the proper set of prefixes equal to a number of search engines used to compress the input data.

16. The method of claim 15, the size of the proper set is eight.

17. The method of claim 13, selecting matching locations from the search engines to compress the input data.

18. The method of claim 13, the first search engine and the second search engine ran in parallel.

19. The method of claim 11, the repeating data is a literal.

20. At least one computer-readable medium, including instructions, which when executed by a machine, cause the machine to perform operations for compressing data using LZ77 compression, the operations comprising:
    determining an initial run from input data, the initial run comprising repeating data at a first location, the initial run having a first length;
    updating a hash chain with a proper set of hashes from prefixes from the initial run;
    determining, using a first search engine, a second run comprising the repeating data at a second location, the second run having a second length less than the first length;
    determining a first matching location within the input data having the repeating data using the hash chain and the second run, the first matching location being the first location; and
    writing the first matching location, the second location, and the second length to an output buffer, the output buffer comprising a compressed version of the second run.

21. The at least one computer-readable medium of claim 20, wherein the operations further comprise updating the first matching location based on the second location, the second length, and the first location.

22. The at least one computer-readable medium of claim 20, wherein the operations further comprise finding, using a second search engine, a second matching location within the input data having the repeating data.

23. The at least one computer-readable medium of claim 22, wherein the operations further comprise selecting the first matching location over the second matching location based on the second length.

24. The at least one computer-readable medium of claim 22, a size of the proper set of prefixes equal to a number of search engines used to compress the input data.

25. The at least one computer-readable medium of claim 24, the size of the proper set is eight.

* * * * *